(12) United States Patent
Heitzer et al.

(10) Patent No.: US 10,571,682 B2
(45) Date of Patent: Feb. 25, 2020

(54) TILTED CHIP ASSEMBLY FOR OPTICAL DEVICES

(71) Applicant: Infineon Technologies AG, Neubiberg (DE)

(72) Inventors: Ludwig Heitzer, Falkenfels (DE); Derek Debie, Bogen (DE); Klaus Elian, Alteglofsheim (DE); Cyrus Ghahremani, Regensburg (DE); Johannes Lodermeyer, Kinding (DE); Oskar Neuhoff, Nittendorf (DE); Johann Strasser, Schierling (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 15/674,149

(22) Filed: Aug. 10, 2017

(65) Prior Publication Data
US 2019/0049716 A1 Feb. 14, 2019

(51) Int. Cl.
| | | |
|---|---|---|
| *G02B 26/08* | (2006.01) | |
| *B81B 7/00* | (2006.01) | |
| *B81C 3/00* | (2006.01) | |
| *G02B 26/10* | (2006.01) | |
| *G01S 7/481* | (2006.01) | |

(52) U.S. Cl.
CPC ........ *G02B 26/0833* (2013.01); *B81B 7/0067* (2013.01); *B81C 3/001* (2013.01); *G01S 7/4813* (2013.01); *G01S 7/4817* (2013.01); *G02B 26/105* (2013.01); *B81B 2201/042* (2013.01); *B81C 2203/032* (2013.01); *B81C 2203/035* (2013.01); *G01S 7/4811* (2013.01)

(58) Field of Classification Search
CPC ............. G02B 26/0833; G02B 26/105; B81B 7/0067; B81B 2201/042; B81C 3/001; B81C 2203/032; B81C 2203/035; G01S 7/4811
USPC ...................................... 359/214.1
See application file for complete search history.

(56) References Cited

U.S. PATENT DOCUMENTS

| | | |
|---|---|---|
| 6,848,306 B2 | 2/2005 | Kunda |
| 7,007,835 B2 | 3/2006 | Deane et al. |
| 7,712,649 B2 | 5/2010 | Kuromochi |
| 7,760,414 B2 | 7/2010 | Schenk et al. |
| 2007/0272727 A1 | 11/2007 | Yang |
| 2009/0065678 A1 | 3/2009 | Vandermeulen et al. |

(Continued)

FOREIGN PATENT DOCUMENTS

| | | |
|---|---|---|
| DE | 10130131 A1 | 1/2002 |
| DE | 102008012810 A1 | 10/2008 |

(Continued)

*Primary Examiner* — Euncha P Cherry
(74) *Attorney, Agent, or Firm* — Design IP

(57) ABSTRACT

A microelectromechanical systems (MEMS) package assembly and a method of manufacturing the same is provided. The MEMS package assembly includes a substrate, a housing coupled to the substrate to form a cavity, wherein the housing includes a transparent plate disposed above and parallel to the substrate and is configured to permit a transmission of light therethrough, and a MEMS chip disposed within the cavity and including a first main surface proximal to the transparent plate and a second main surface opposite to the first main surface and coupled to the substrate. The MEMS chip is oriented such that the first main surface is tilted at a tilt angle with respect to the transparent plate.

16 Claims, 4 Drawing Sheets

(56) References Cited

U.S. PATENT DOCUMENTS

| | | |
|---|---|---|
| 2009/0073526 A1* | 3/2009 | Uchikawa ............ G02B 26/105 359/202.1 |
| 2010/0122456 A1 | 5/2010 | Yu et al. |
| 2013/0005055 A1 | 1/2013 | Lin et al. |
| 2014/0124917 A1 | 5/2014 | Lee et al. |
| 2016/0062109 A1 | 3/2016 | Morikawa et al. |
| 2019/0135619 A1 | 5/2019 | Quenzer et al. |

FOREIGN PATENT DOCUMENTS

| | | |
|---|---|---|
| DE | 102016105440 A1 | 9/2017 |
| JP | H0429341 A | 1/1992 |
| WO | 2013108252 A1 | 7/2013 |

* cited by examiner

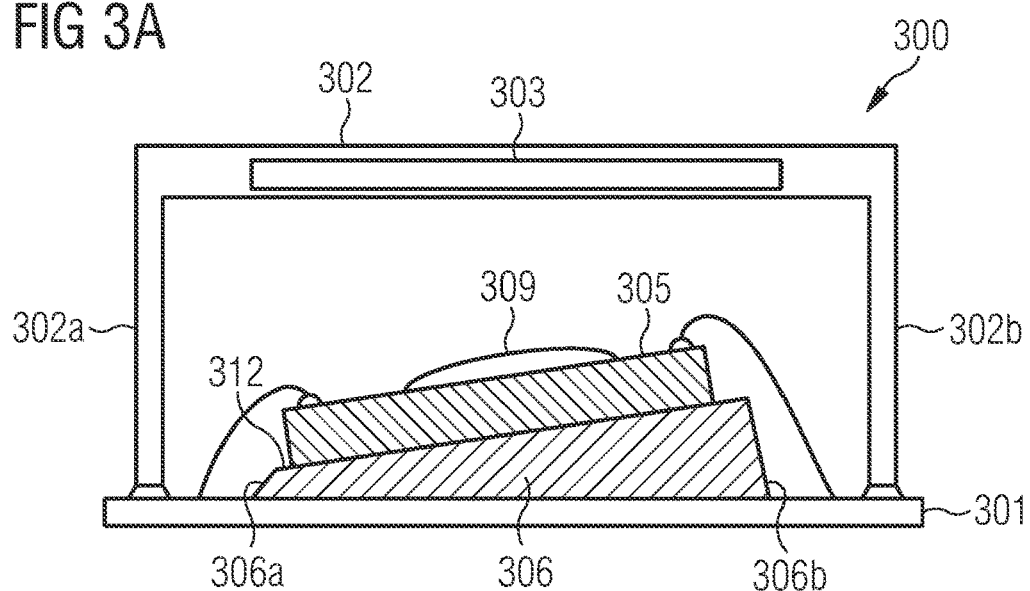
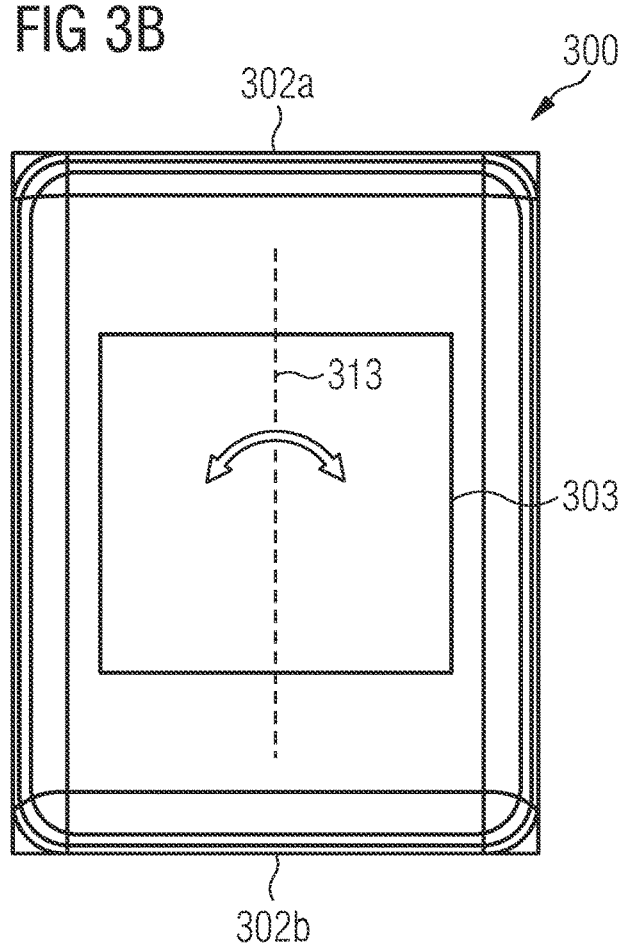

TILTED CHIP ASSEMBLY FOR OPTICAL DEVICES

FIELD

The present disclosure relates generally to devices and methods related to integrated optical systems, and, more particularly, to a tilted chip assembly used in optical systems.

BACKGROUND

Light Detection and Ranging (LIDAR), is a remote sensing method that uses light in the form of a pulsed laser to measure ranges (variable distances) to an object. In particular, light is transmitted towards the object and the time it takes to return to its source is measured. This is also referred to as measuring time-of-flight (TOF).

LIDAR sensors are an essential element in future fully autonomous or semi-autonomous self-driving cars. The system operates on the principle of TOF measurement. A very short laser pulse is transmitted, hits an object, is reflected and detected by a sensor. From the time-of-flight of the laser beam it is possible to calculate the distance to the object. Scanning LIDAR systems scan the surroundings of the car horizontally with a laser beam across a certain angular segment and produce a three-dimensional (3D) map of the environment. In most cases, the laser beams in present-day scanning LIDAR systems are deflected by means of mechanical moving mirrors (i.e., microelectromechanical systems (MEMS) micro-mirrors). Some solutions make use of several laser diodes mounted one on top of the other to extend the vertical field of view.

In current LIDAR systems, a chip assembly may be used with a tilted protective glass arranged over a MEMS micro-mirror. The glass is tilted in order to reduce the amount of light reflected off the back side of the glass back onto the MEMS micro-mirror, referred to as static reflection. The static reflection back onto the MEMS micro-mirror would cause inaccuracies, including a "blurring" in the return image. However, this method has a disadvantage in that it results in a non-planar package outline that complicates a full automatic board assembly process.

SUMMARY

A microelectromechanical systems (MEMS) package assembly and a method of manufacturing the same are provided.

According to one or more embodiments, a MEMS package assembly includes a substrate, a housing coupled to the substrate to form a cavity, wherein the housing includes a transparent plate disposed above and parallel to the substrate and is configured to permit a transmission of light therethrough, and a MEMS chip disposed within the cavity and including a first main surface proximal to the transparent plate and a second main surface opposite to the first main surface and coupled to the substrate. The MEMS chip is oriented such that the first main surface is tilted at a tilt angle with respect to the transparent plate.

According to one or more embodiments, a method of manufacturing a tilted chip package assembly, includes attaching a microelectromechanical systems (MEMS) chip, having a first main surface, to a substrate having a planar main surface proximal to the MEMS chip, wherein the MEMS chip is oriented such that the first main surface of the MEMS chip is tilted at a tilt angle with respect to the planar main surface of the substrate; and attaching a housing to the planar main surface of the substrate to form a cavity in which the MEMS chip resides, wherein the housing includes a transparent plate disposed above and parallel to the planar main surface of the substrate and is configured to permit a transmission of light therethrough. The method of manufacturing may further include disposing a die attach layer onto the planar main surface of the substrate, the die attach layer configured to receive the MEMS chip at a first surface of the die attach layer to attach the MEMS chip to the substrate, wherein the die attach layer has a wedge shape such that the first surface of the die attach layer is tilted at the tilt angle.

The transparent plate may include a first planar surface and a second planar surface that define a thickness of the transparent plate and are parallel to the planar main surface of the substrate.

The first main surface of the MEMS chip may be a planar surface defining a tilt plane that is inclined according to the tilt angle, the tilt angle is congruent to an interior angle formed by an intersection of the tilt plane and a plane defined by the transparent plate, and the tilt angle is at least 10°.

BRIEF DESCRIPTION OF THE DRAWINGS

Embodiments are described herein making reference to the appended drawings.

FIGS. 3A and 3B illustrate sectional views of a chip package in accordance with one or more embodiments;

DETAILED DESCRIPTION

Figure 1:
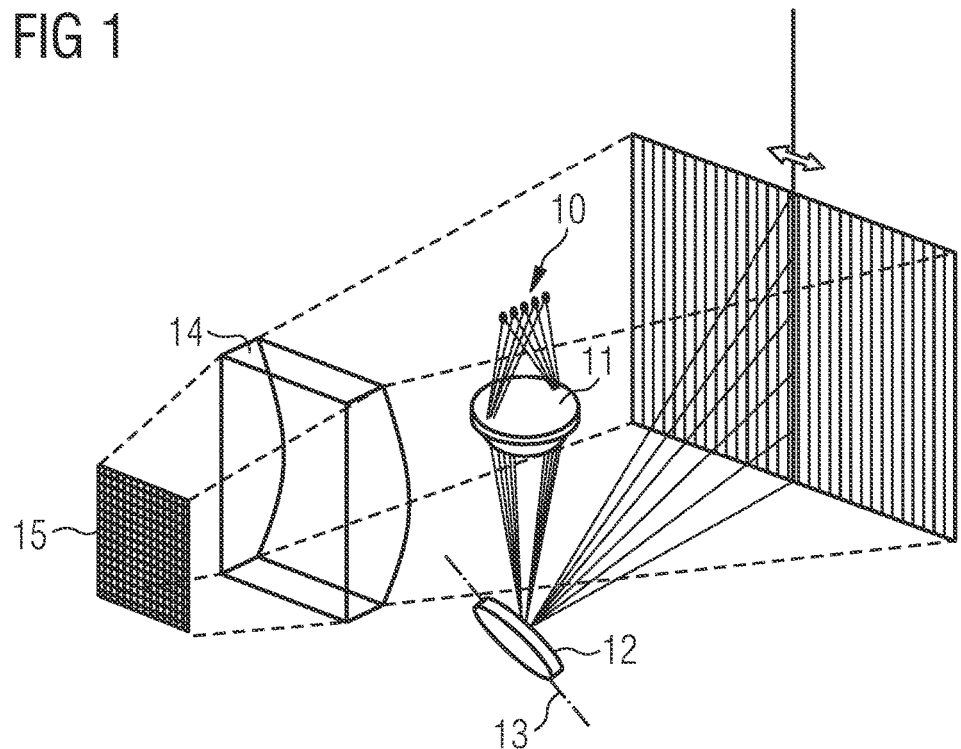
FIG. 1 illustrates a schematic view of a Light Detection and Ranging (LIDAR) scanning system in accordance with one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photos of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

According to one or more embodiments, an integrated optical system is provided with a tilted chip assembly. The tilted chip assembly may be incorporated in a chip package and may be used in Light Detection and Ranging (LIDAR) applications. For example, the tilted chip assembly may be provided to reduce optical effects (e.g., static reflection) inside the package that would otherwise be caused by light reflected by a microelectromechanical systems (MEMS) micro-mirror integrated with the chip, disposed within the package. In particular, the chip may be oriented such that its main, upper surface has a defined angle (e.g., at least) 10° with respect to a substrate such that it is not plane-parallel to the substrate. Meanwhile, a protective glass disposed over the chip is arranged parallel to the substrate.

FIG. 1 illustrates a LIDAR scanning system 100 in accordance with one or more embodiments. The LIDAR scanning system 100 includes a transmitter, including laser sources 10, a first optical component 11 and a one-dimensional (1D) MEMS mirror 12, and a receiver, including a second optical component 14 and a two-dimensional (2D) detector array 15.

The laser sources 10 are linearly aligned in single bar formation and are configured to transmit light used for scanning an object. The light transmitted from the laser sources 10 are directed towards the first optical component 11 configured to focus each laser onto a one-dimensional MEMS mirror 12. The first optical component 11 may be, for example, a lens. When reflected by the MEMS mirror 12, the light from the laser sources 10 are aligned vertically to form a vertical scanning line. The MEMS mirror 12 is configured to oscillate "side-to-side" about a scanning axis 13 such that the light reflected from the MEMS mirror 12 (i.e., the vertical scanning line) oscillates back and forth in a horizontal scanning direction.

Upon impinging one or more objects, the transmitted light is reflected back towards the LIDAR scanning system 100 where the second optical component 14 (e.g., a lens) receives the reflected light. The second optical component 14 directs the reflected light onto the detector array 15 that is configured to generate measurement signals used for generating a 3D map of the environment based on the reflected light (e.g., via TOF calculations and processing). For example, the detector array 15 may be an array of photodiodes or other light detection component capable of detecting and measuring light and generating electric signals therefrom.

Figure 2:
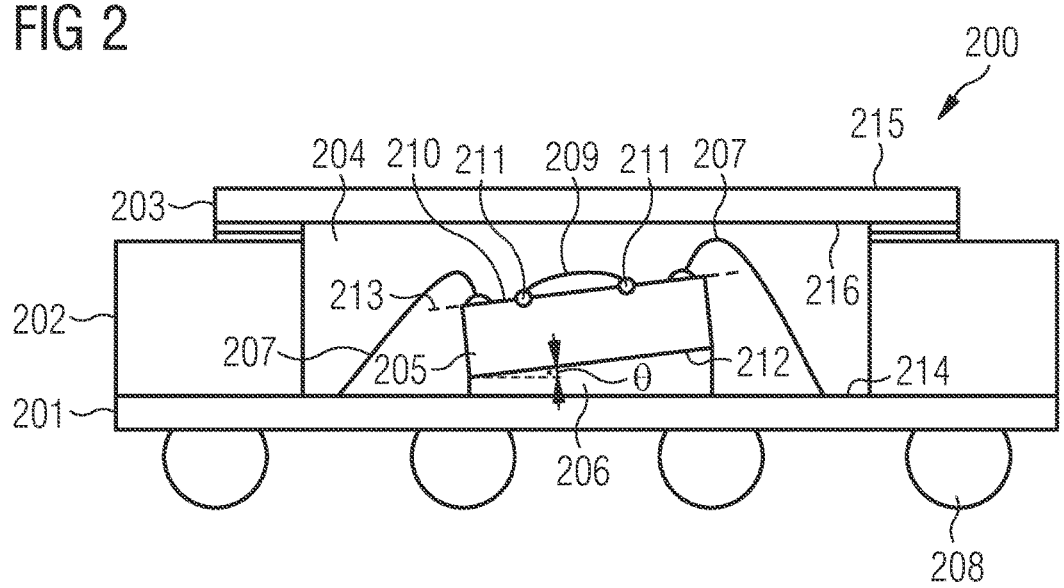
FIG. 2 illustrates a cross-sectional schematic view of a chip package in accordance with one or more embodiments.

FIG. 2 illustrates a chip package 200 in accordance with one or more embodiments. In particular, the chip package 200 may be referred to as an optical package and includes a substrate 201, an encapsulation component 202 and a glass substrate 203 that make up the packaging of the sensor package 200, where there glass substrate 203 may be a glass cover, glass lid, or the like. The substrate 201 and the glass substrate 203 are arranged parallel or substantially parallel to each other which may simplify an assembly process.

Inside the packaging, in a cavity 204, a MEMS device 205 is bonded to the substrate 201 by a die attach layer 206. The MEMS device 205 may be referred to as a die or a chip with an integrated MEMS. The packaging itself may be referred to as a chip-carrier.

The substrate 201 may be, for example, a leadframe, a laminate substrate (e.g., a printed circuit board (PCB) or the like), or a ceramic base plate that includes electrically conductive pads (not shown) on an upper and a lower surface thereof that are connected via electrically conductive paths provided therebetween. The conductive pads on the upper and the lower surfaces provide electrical connections to bonding wires 207 and solder balls 208, respectively. The solder balls 208 are bonded to the pads on the bottom of the chip package 200 for connecting the chip package 200 to a circuit board (e.g., a PCB) or the like. The solder balls 208 may form a ball grid array (BGA). Thus, the bonding wires 207 and solder balls 208 carry electrical signals between the integrated circuit on a chip and an external device (via the PCB).

It will be appreciated that while embodiments herein describe one or more types of chip packaging, these are merely examples and the embodiments are not limited thereto. Thus, other types of integrated circuit (IC) packaging, materials and configurations may be used. For example, a lead frame instead of solder balls may be used for connecting the chip package 200 to a PCB. In other instances, the frame may be leadless or land grid array (LGA) mounting may be used.

The encapsulation component 202 forms part of a protective housing around at least part of the MEMS device 205 and may be a metal, plastic (e.g., mold resin), glass or ceramic casing. The encapsulation component 202 may also be referred to as a package housing.

The glass substrate 203 is a plane of glass, such as a glass cover or lid, disposed on the encapsulation component 202 and is adhered thereto by an adhesive or solder, for example, in the case of a hermetic package. The glass substrate 203 forms an upper portion of the protective housing and is arranged over the MEMS device 205 such that the MEMS device 205 is enclosed within the packaging inside cavity 204. The glass substrate 203, as well as the package as a whole, protects the MEMS device 205 from the outside environment and may aid in assembly of the chip package 200 in a final product.

While a glass substrate 203 is used in this example, other transparent materials that permit the transmission of light therethrough may also be used. Thus, the glass substrate 203 may generally be referred to as a transparent plate. Furthermore, the glass substrate 203 may be coated on both sides with an antireflective coating to reduce reflections of light (e.g., light from the laser sources) and to filter out light in undesired spectrums (e.g., light from the environment).

The MEMS device 205 may be a semiconductor chip or die that has a MEMS component such as a MEMS mirror 209 integrated therewith. The MEMS mirror 209 may be a silicon-based solid-state MEMS micro-mirror integrated onto the chip. The MEMS mirror 209 is arranged at an upper surface 210 of the chip such that it can receive and reflect light received through the glass plate 203. The MEMS mirror 209 is coupled to the chip at pivot points 211 that are aligned on a scanning axis 213 such that the MEMS mirror 209 is configured to move about the scanning axis 213 that extends parallel to a tilt plane of the MEMS device 205 (i.e., parallel to the upper surface 210). For example, the MEMS mirror 209 may be controlled to oscillate back and forth about the scanning axis to perform a horizontal scanning operation.

The MEMS device 205 further includes an integrated circuit for controlling the movement (e.g., the oscillation) of the MEMS mirror 209, and may receive or transmit electric signals via the bonding wires 207. For example, the integrated circuit may include a microprocessor that is configured to control a driver of the MEMS mirror 209 according to a protocol and/or according to control signals received from an external device via the bonding wires 207. For example, an on/off state, an range of movement (e.g., an oscillation range between +/−30° about the axis) and an oscillation frequency of the MEMS mirror 209 may be controlled and varied according to application by the microprocessor. In one example, the oscillation frequency may be 20 kHz, but is not limited thereto.

The MEMS device 205 is die attached or bonded to the substrate 201 at a tilt angle θ by a die attach layer 206, such as an adhesive, film, paste, epoxy, low stress glue (e.g., silicone), or the like. The MEMS device 205 is placed on the die attach layer 206 at a predefined tilt angle θ sufficient to reduce static reflections of light that may otherwise occur at the backside of the glass substrate 203 when the light is reflected outward by the MEMS mirror 209. For example, the tilt angle θ may be 10° or greater with respect to the plane of the glass substrate 203. The tilt angle θ is congruent to an interior angle formed by an intersection of the tilt plane defined by the upper surface 210 and a plane defined the main surface(s) of the glass substrate 203. It is further noted that the scanning axis also has the same tilt angle θ with respect to the plane of the glass substrate 203 since the scanning axis is aligned parallel to the upper surface 210 of the MEMS device 205. Here, the MEMS mirror 209 is configured to oscillate about the scanning axis orthogonal to the viewing plane of FIG. 2.

The upper surface 210 of the MEMS device 205 may be referred as a first main surface. The upper surface 210 may be a planar surface defining a tilt plane that is inclined according to the tilt angle. In addition, the substrate includes a planar main surface 214 proximal to the MEMS device 205 and to which the housing 202/203 is coupled. The glass substrate 203 includes a first planar surface 215 and a second planar surface 216 that define a thickness of the transparent plate and are parallel to the planar main surface 214 of the substrate.

In order to achieve a tilt angle, the MEMS device 205 may be placed on the die attach layer 206 such that one side (e.g., the left side in this example) of the MEMS device 205 makes contact with the die attach layer 206 before the second side makes contact with the die attach layer 206 such that it is placed at the desired tilt angle. In addition or in the alternative, a greater amount of pressure may be applied to one side (e.g., the left side in this example) of the MEMS device 205 than the other side such that the one side is pressed into the die attach layer 206 more deeply than the other side to produce the desired tilt angle. Thus, the die attach layer 206 has an asymmetric shape such that its main surface 212 has a tilt angle relative to the plane of the glass substrate 203. Once the MEMS device 205 is placed at a desired tilt angle (or the die attach layer 206 is formed with the desired asymmetric shape), the die attach layer 206 can be hardened by a curing process to fix the MEMS device 205 according to its desired orientation.

While a main portion of light transmitted by the laser sources and received by the MEMS mirror 209 is transmitted through the glass substrate 203 via reflection from the MEMS mirror 209, a smaller, secondary portion of the light may be reflected back into the cavity 204 by the backside of the glass substrate. However, due to the tilt angle of the MEMS device 205 relative to the glass substrate 203, the amount of light reflected back towards the MEMS device 205 by the backside of the glass substrate 203 may be reduced and system performance may be improved. That is, even though some portion of light may be reflected back into the cavity 204, the amount of light that is actually reflected back at the MEMS mirror 209 and impinges thereon may be reduced due to the asymmetric geometry of the die attach layer 206 and/or the tilt angle of the MEMS device 205. Thus, the inner-housing reflection may be optimized according to the tilt angle of the MEMS device 205, and, more specifically, the tilt angle of the MEMS mirror 209.

FIGS. 3A and 3B illustrate a chip package 300 in accordance with one or more embodiments. In particular, FIG. 3A shows a cross-sectional view of the chip package 30, while FIG. 3B shows a plan view of the chip package 300.

The chip package 300 is similar to the chip package 200 shown in FIG. 2 with the exception of using a different housing 302. Therefore, similar features shown in FIGS. 3A and 3B will not be described in detail. Both chip packages 200 and 300 may be hermetically sealed to protect their internal devices.

The chip package 300 includes a housing 302 that is attached to the substrate 301. For example, the housing 302 may be a metal cap with an integrated glass substrate 303. The metal cap may be attached to the substrate 301 by soldering. In addition, the glass substrate 303 provides a window for light from the LIDAR light sources and reflected light from the MEMS mirror to pass therethrough.

The housing 302 has a first side 302a that is in proximity to one side 306a of the die attach layer 306, and has a second side 302b that is in proximity to an opposing side 306b of the die attach layer 306. A thickness of the die attach layer 306 at side 306a is less than the thickness of the die attach layer 306 at side 306b due to the tilt angle of the main surface 312 of the die attach layer 306.

As shown in FIG. 3B, the scanning axis 313 extends parallel to the tilt plane of the MEMS device 305. Thus, the MEMS mirror 309 oscillates orthogonal to the tilt plane of the MEMS device 305.

Figure 4:
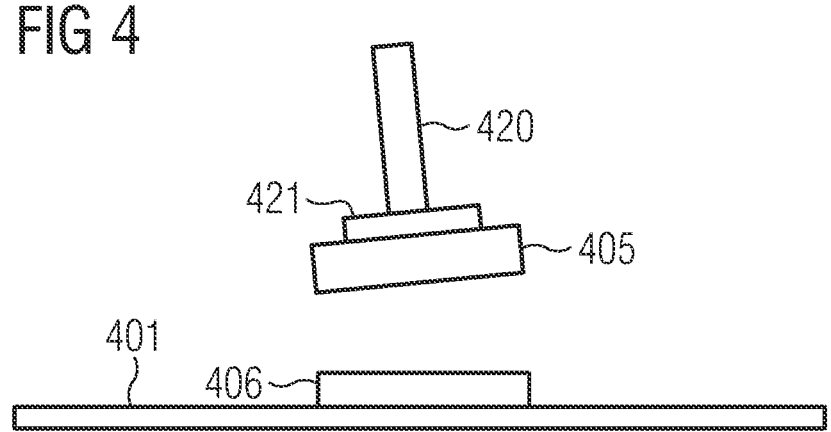
FIG. 4 shows a cross-sectional diagram illustrating a tilted chip assembly process according to one or more embodiments.

FIG. 4 illustrates an assembly process according to one or more embodiments. For example, a die attach layer 406 may be disposed on a substrate 401 with a symmetric or substantially symmetric shape. Thereafter, a tilted bond head tool 420 with a rubber tip 421 configured to carry a MEMS device 405 may be used to place the MEMS device 405 onto the die attach layer 406. The bond head tool 420 is tilted at an angle in order to place the MEMS device 405 onto the die attach layer 406 at the desired tilt angle prior to curing the die attach layer 406. The MEMS device 405 may then be enclosed within a housing to complete assembly of the package.

Figure 5:
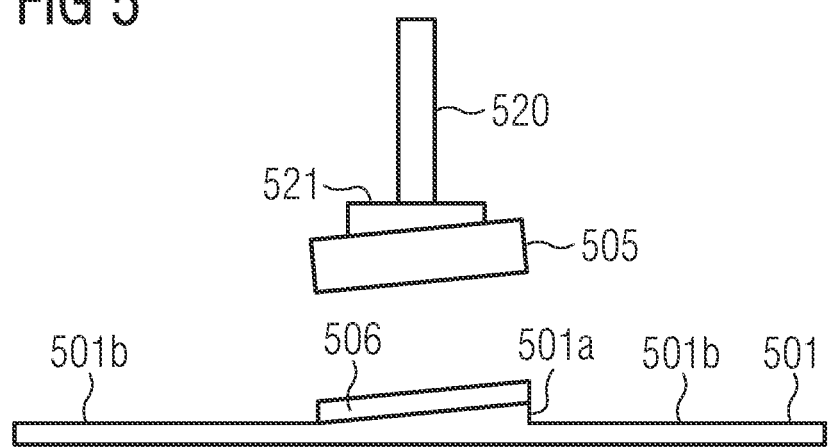
FIG. 5 shows a cross-sectional diagram illustrating another embodiment of a tilted chip assembly according to one or more embodiments.

FIG. 5 illustrates another embodiment for achieving a tilt angle of a MEMS device according to one or more embodiments. For example, substrate 501 may include a tilted assembly pad 501a for receiving a die attach layer 506 and MEMS device 505. The tilted assembly pad 501a, together with substrate 501 forms a single integral member, extends from the remaining portion 501b of the substrate 501 at a tilt angle. Thus, the tilted assembly pad 501a has an asymmetric shape with its main surface tilted according to the tilt angle. Die attach layer 506 is disposed on the main surface of the tilted assembly pad 501a, and the MEMS device 505 is disposed thereon prior to curing the die attach layer 506. Due to the tilt angle of the tilted assembly pad 501a, the MEMS device 505 may be placed onto the die attach layer 506 by bond tool 520 such that a bottom surface of the MEMS device 505 and an upper surface of the die attach layer 506 are parallel to each other. The bond tool 520 may have an angled rubber tip 521 that is configured to hold the MEMS device 505 at an angle congruent with the tilt angle of the tilted assembly pad 501a. The MEMS device 505 may then be enclosed within a housing to complete assembly of the package.

It will be appreciated that the angled rubber tip 521 is one example of a possible tool, and that the bond tool 520 is not limited thereto. For example, the bond tool 520 may include any picking tool or nozzle that is configured to hold and place a chip, such as MEMS device 505, in accordance with one or more embodiments described herein.

Figure 6:
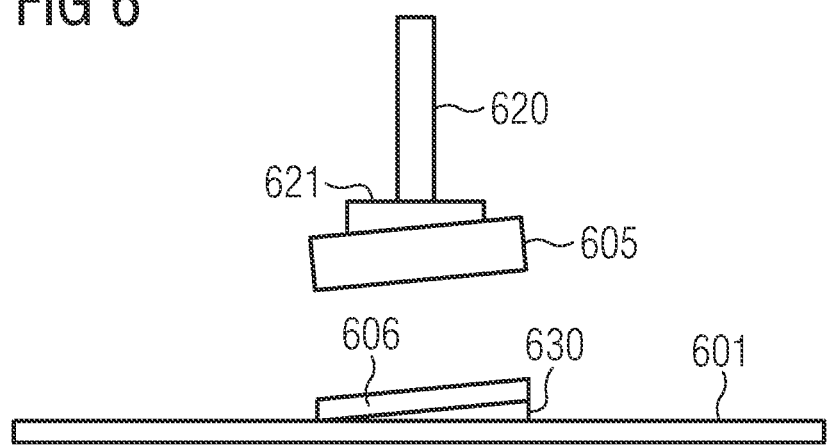
FIG. 6 shows a cross-sectional diagram illustrating another embodiment of a tilted chip assembly according to one or more embodiments.

FIG. 6 illustrates another embodiment for achieving a tilt angle of a MEMS device according to one or more embodiments. In particular, a wedge structure 630 may be disposed on the substrate 601. Similar to the tilted assembly pad 501a in FIG. 5, the wedge structure 630 is configured with a main surface tilted at a tilt angle. The wedge structure 630 may be made of ceramic, silicon or plastic, but is not limited thereto.

A die attach layer 606 is disposed on the main surface of the wedge structure 630, and the MEMS device 605 is disposed thereon prior to curing the die attach layer 606. Due to the tilt angle of the wedge structure 630, the MEMS device 630 may be placed onto the die attach layer 606 by bond tool 620 such that a bottom surface of the MEMS device 605 and an upper surface of the die attach layer 606 are parallel to each other. The bond tool 620 may have an angled rubber tip 621 that is configured to hold the MEMS device 605 at an angle congruent with the tilt angle of the wedge structure 630. The MEMS device 605 may then be enclosed within a housing to complete assembly of the package.

Figure 7:
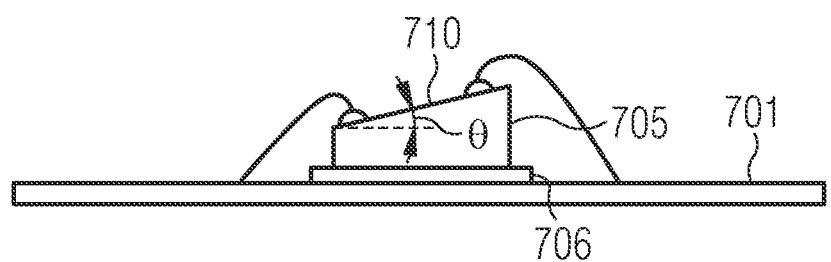
FIG. 7 shows a cross-sectional diagram illustrating another embodiment of a tilted chip assembly according to one or more embodiments.

FIG. 7 illustrates another embodiment for achieving a tilt angle of a MEMS device according to one or more embodiments. Here, the tilt angle of the MEMS mirror may be realized by an asymmetric shape of the MEMS device 705. For example, a backside of the MEMS device 705 (i.e., bottom side of the wafer) may be etched at an angle such that, when the MEMS device 705 is placed in the die attach layer 706, the MEMS device 705 has a tilted surface 710 where the MEMS mirror is arranged. According to this arrangement, the MEMS mirror is tilted according to a tilt angle $\theta$ with respect to the glass substrate/window (not shown). Thus, the die attach layer 706 used to fix the MEMS device 705 to the substrate 701 may be cured with a symmetric or substantially symmetric shape (i.e., with a main surface extending parallel to the substrate and glass substrate/window), while still achieving a tilt angle of the MEMS mirror. Alternatively, the die attach layer 706 may be cured having an asymmetric shape such that its main surface is also tilted similar to that shown in FIG. 2 and may be further used to adjust the tilt angle of the MEMS mirror with respect to the glass substrate/window.

Although embodiments described herein relate to a MEMS device with a mirror, it is to be understood that other implementations may include optical devices other than MEMS mirror devices. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structures or any other structure suitable for implementation of the techniques described herein. In addition, in some aspects, the functionality described herein may be provided within dedicated hardware and/or software modules. Also, the techniques could be fully implemented in one or more circuits or logic elements.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A microelectromechanical systems (MEMS) package assembly comprising:
a substrate;
a housing coupled to the substrate to form a cavity, wherein the housing includes a transparent plate disposed above and parallel to the substrate and is configured to permit a transmission of light therethrough; and a MEMS chip disposed within the cavity and including a first main surface proximal to the transparent plate and a second main surface opposite to the first main surface and coupled to the substrate,
wherein the MEMS chip is oriented such that the first main surface is tilted at a tilt angle with respect to the transparent plate,
the MEMS chip includes a mirror integrated at the first main surface and the mirror is configured to rotate about an axis that extends parallel to a tilt plane of the first main surface such that the axis is tilted at the tilt angle, and
wherein the first main surface of the MEMS chip is a planar surface defining a tilt plane that is inclined with respect to the substrate according to the tilt angle; and
a die attach layer configured to attach the MEMS chip to the substrate, wherein the second main surface of the MEMS chip is directly attached to a first surface of the die attach layer such that the MEMS chip is directly disposed onto the die attach layer, and wherein a second surface of the die attach layer is disposed onto the substrate,
wherein the die attach layer has a wedge shape such that the first surface of the die attach layer is tilted parallel to the tilt plane and the second surface of the die attach layer is parallel relative to the substrate.

2. The MEMS package assembly of claim 1, wherein:
the mirror is configured to receive the light transmitted through the transparent plate and to reflect the received light back at the transparent plate for transmission therethrough.

3. The MEMS package assembly of claim 1, wherein:
the tilt angle is congruent to an interior angle formed by an intersection of the tilt plane and a plane defined by the transparent plate.

4. The MEMS package assembly of claim 1, further comprising:
a wedge structure disposed between the substrate and the MEMS chip,
wherein the wedge structure has a wedge surface tilted parallel to the tilt plane.

5. The MEMS package assembly of claim 1, wherein:
the substrate includes a planar main surface proximal to the MEMS chip and to which the housing is coupled thereto.

6. The MEMS package assembly of claim 5, wherein:
the transparent plate includes a first planar surface and a second planar surface that define a thickness of the transparent plate and are parallel to the planar main surface of the substrate.

7. A microelectromechanical systems (MEMS) package assembly comprising:
a substrate;
a housing coupled to the substrate to form a cavity, wherein the housing includes a transparent plate disposed above and parallel to the substrate and is configured to permit a transmission of light therethrough; and
a MEMS chip disposed within the cavity and including a first main surface proximal to the transparent plate and a second main surface opposite to the first main surface and coupled to the substrate,
wherein the MEMS chip is oriented such that the first main surface is tilted at a tilt angle with respect to the transparent plate,
the MEMS chip includes a mirror integrated at the first main surface and the mirror is configured to rotate about an axis that extends parallel to a tilt plane of the first main surface such that the axis is tilted at the tilt angle,
wherein the first main surface of the MEMS chip is a planar surface defining a tilt plane that is inclined with respect to the substrate according to the tilt angle; and
wherein the substrate includes a tilted assembly pad having a wedge shape that protrudes from a main body of the substrate, wherein the tilted assembly pad has a pad surface bonded to the second main surface of the MEMS chip, the pad surface being tilted parallel to the tilt plane.

8. The MEMS package assembly of claim 7, wherein:
the tilted assembly pad forms a single integral member with the substrate and extends from a main surface of the substrate that is parallel to the transparent plate.

9. The MEMS package assembly of claim 7, further comprising:
a die attach layer configured to attach the MEMS chip, disposed at a first surface of the die attach layer, to the tilted assembly pad, disposed at a second surface of the die attach layer such that the first surface of the die attach layer is in direct contact with the second main surface of the MEMS chip,
wherein the first surface of the die attach layer is tilted parallel to the tilt plane.

10. A microelectromechanical systems (MEMS) package assembly comprising:
a substrate;
a housing coupled to the substrate to form a cavity, wherein the housing includes a transparent plate disposed above and parallel to the substrate and is configured to permit a transmission of light therethrough; and
a MEMS chip disposed within the cavity and including a first main surface proximal to the transparent plate and a second main surface opposite to the first main surface and coupled to the substrate,
wherein the MEMS chip is oriented such that the first main surface is tilted at a tilt angle with respect to the transparent plate,
the MEMS chip includes a mirror integrated at the first main surface and the mirror is configured to rotate about an axis that extends parallel to a tilt plane of the first main surface such that the axis is tilted at the tilt angle, and
wherein the first main surface of the MEMS chip is a planar surface defining a tilt plane that is inclined with respect to the substrate according to the tilt angle; and
a wedge structure disposed between the substrate and the MEMS chip, wherein the wedge structure has a wedge surface tilted parallel to the tilt plane; and
a die attach layer configured to attach the MEMS chip, disposed at a first surface of the die attach layer, to the wedge structure, disposed at a second surface of the die attach layer such that the first surface of the die attach layer is in direct contact with the second main surface of the MEMS chip,
wherein the first surface of the die attach layer is parallel to the tilt plane.

11. A microelectromechanical systems (MEMS) package assembly comprising:
a substrate;
a housing coupled to the substrate to form a cavity, wherein the housing includes a transparent plate disposed above and parallel to the substrate and is configured to permit a transmission of light therethrough; and a MEMS chip disposed within the cavity and including a first main surface proximal to the transparent plate and a second main surface opposite to the first main surface and coupled to the substrate, wherein the MEMS chip is oriented such that the first main surface is tilted at a tilt angle with respect to the transparent plate, the MEMS chip includes a mirror integrated at the first main surface and the mirror is configured to rotate about an axis that extends parallel to a tilt plane of the first main surface such that the axis is tilted at the tilt angle, and wherein the first main surface of the MEMS chip is a planar surface defining a tilt plane that is inclined with respect to the substrate according to the tilt angle; and a die attach layer configured to attach the MEMS chip to the substrate, wherein the second main surface of the MEMS chip is directly attached to a first surface of the die attach layer such that the MEMS chip is directly disposed onto the die attach layer, and wherein a second surface of the die attach layer is disposed onto the substrate, wherein the MEMS chip has a wedge shape, wherein the first main surface of the MEMS chip is tilted parallel to the tilt plane and the second main surface of the MEMS chip is parallel relative to the substrate.

12. A method of manufacturing a tilted chip package assembly, comprising:

attaching a microelectromechanical systems (MEMS) chip, having a first main surface, to a substrate having a planar main surface proximal to the MEMS chip, wherein the MEMS chip is oriented such that the first main surface of the MEMS chip is tilted at a tilt angle with respect to the planar main surface of the substrate, wherein the MEMS chip includes a mirror integrated at the first main surface and the mirror is configured to rotate about an axis that extends parallel to a tilt plane of the first main surface such that the axis is tilted at the tilt angle;

attaching a housing to the planar main surface of the substrate to form a cavity in which the MEMS chip resides, wherein the housing includes a transparent plate disposed above and parallel to the planar main surface of the substrate and is configured to permit a transmission of light therethrough; and disposing a die attach layer onto the planar main surface of the substrate, the die attach layer configured to receive the MEMS chip at a first surface of the die attach layer to attach the MEMS chip to the substrate, wherein a second main surface of the MEMS chip, arranged opposite to the first main surface, is directly attached to a first surface of the die attach layer such that the MEMS chip is directly disposed onto the die attach layer, wherein the die attach layer has a wedge shape such that the first surface of the die attach layer is tilted at the tilt angle and a second surface of the die attach layer is disposed onto the substrate and is parallel relative to the substrate.

13. The method of manufacturing of claim 12, wherein: the transparent plate includes a first planar surface and a second planar surface that define a thickness of the transparent plate and are parallel to the planar main surface of the substrate.

14. The method of manufacturing of claim 12, wherein: the first main surface of the MEMS chip is a planar surface defining a tilt plane that is inclined according to the tilt angle.

15. The method of manufacturing of claim 12, wherein attaching the MEMS chip to the substrate comprises:
applying the MEMS chip to a die attach layer at the tilt angle using a tilted tool.

16. A method of manufacturing a tilted chip package assembly, comprising:

attaching a microelectromechanical systems (MEMS) chip, having a first main surface, to a substrate having a planar main surface proximal to the MEMS chip, wherein the MEMS chip is oriented such that the first main surface of the MEMS chip is tilted at a tilt angle with respect to the planar main surface of the substrate, wherein the MEMS chip includes a mirror integrated at the first main surface and the mirror is configured to rotate about an axis that extends parallel to a tilt plane of the first main surface such that the axis is tilted at the tilt angle;

attaching a housing to the planar main surface of the substrate to form a cavity in which the MEMS chip resides, wherein the housing includes a transparent plate disposed above and parallel to the planar main surface of the substrate and is configured to permit a transmission of light therethrough;

attaching a wedge structure to the planar main surface of the substrate, wherein the wedge structure has a wedge surface tilted at the tilt angle; and attaching the MEMS chip to the wedge surface via a die attach layer, wherein the die attach layer is configured to attach the MEMS chip, disposed at a first surface of the die attach layer, to the wedge structure, disposed at a second surface of the die attach layer such that the first surface of the die attach layer is in direct contact with a second main surface of the MEMS chip, wherein the second main surface of the MEMS chip is arranged opposite to the first main surface.

* * * * *